(12) United States Patent
Kim et al.

(10) Patent No.: US 11,658,241 B2
(45) Date of Patent: May 23, 2023

(54) VERTICAL TRENCH GATE MOSFET WITH INTEGRATED SCHOTTKY DIODE

(71) Applicant: Texas Instruments Incorporated, Dallas, TX (US)

(72) Inventors: Sunglyong Kim, Allen, TX (US); Seetharaman Sridhar, Richardson, TX (US); Hong Yang, Richardson, TX (US); Ya Ping Chen, Chengdu (CN); Thomas Eugene Grebs, Bethlehem, PA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/237,210

(22) Filed: Dec. 31, 2018

(65) Prior Publication Data

US 2020/0212219 A1 Jul. 2, 2020

(51) Int. Cl.
| | | |
|---|---|---|
| H01L 29/78 | (2006.01) | |
| H01L 27/088 | (2006.01) | |
| H01L 29/423 | (2006.01) | |
| H01L 29/872 | (2006.01) | |
| H01L 21/8234 | (2006.01) | |
| H01L 29/40 | (2006.01) | |

(52) U.S. Cl.
CPC .. *H01L 29/7827* (2013.01); *H01L 21/823437* (2013.01); *H01L 21/823487* (2013.01); *H01L 27/088* (2013.01); *H01L 29/407* (2013.01); *H01L 29/4236* (2013.01); *H01L 29/872* (2013.01)

(58) Field of Classification Search
CPC ............... H01L 29/7827; H01L 29/407; H01L 29/4236; H01L 29/872; H01L 21/823437; H01L 21/823487; H01L 27/088
USPC ....................................................... 257/334
See application file for complete search history.

(56) References Cited

U.S. PATENT DOCUMENTS

| | | | | |
|---|---|---|---|---|
| 7,863,685 B2 * | 1/2011 | Hshieh | ................ | H01L 29/1095 257/368 |
| 8,816,429 B2 * | 8/2014 | Grebs | ............... | H01L 29/66727 257/330 |
| 2014/0217497 A1 | 8/2014 | Kawahara et al. | | |
| 2016/0329423 A1 * | 11/2016 | Kawahara | ............ | H01L 29/063 |

* cited by examiner

*Primary Examiner* — Dao H Nguyen
(74) *Attorney, Agent, or Firm* — Andrew R. Ralston; Frank D. Cimino

(57) ABSTRACT

An integrated circuit includes a trench gate MOSFET including MOSFET cells. Each MOSFET cell includes an active trench gate in an n-epitaxial layer oriented in a first direction with a polysilicon gate over a lower polysilicon portion. P-type body regions are between trench gates and are separated by an n-epitaxial region. N-type source regions are located over the p-type regions. A gate dielectric layer is between the polysilicon gates and the body regions. A metal-containing layer contacts the n-epitaxial region to provide an anode of an embedded Schottky diode. A dielectric layer over the n-epitaxial layer has metal contacts therethrough connecting to the n-type source regions, to the p-type body regions, and to the anode of the Schottky diode.

20 Claims, 17 Drawing Sheets

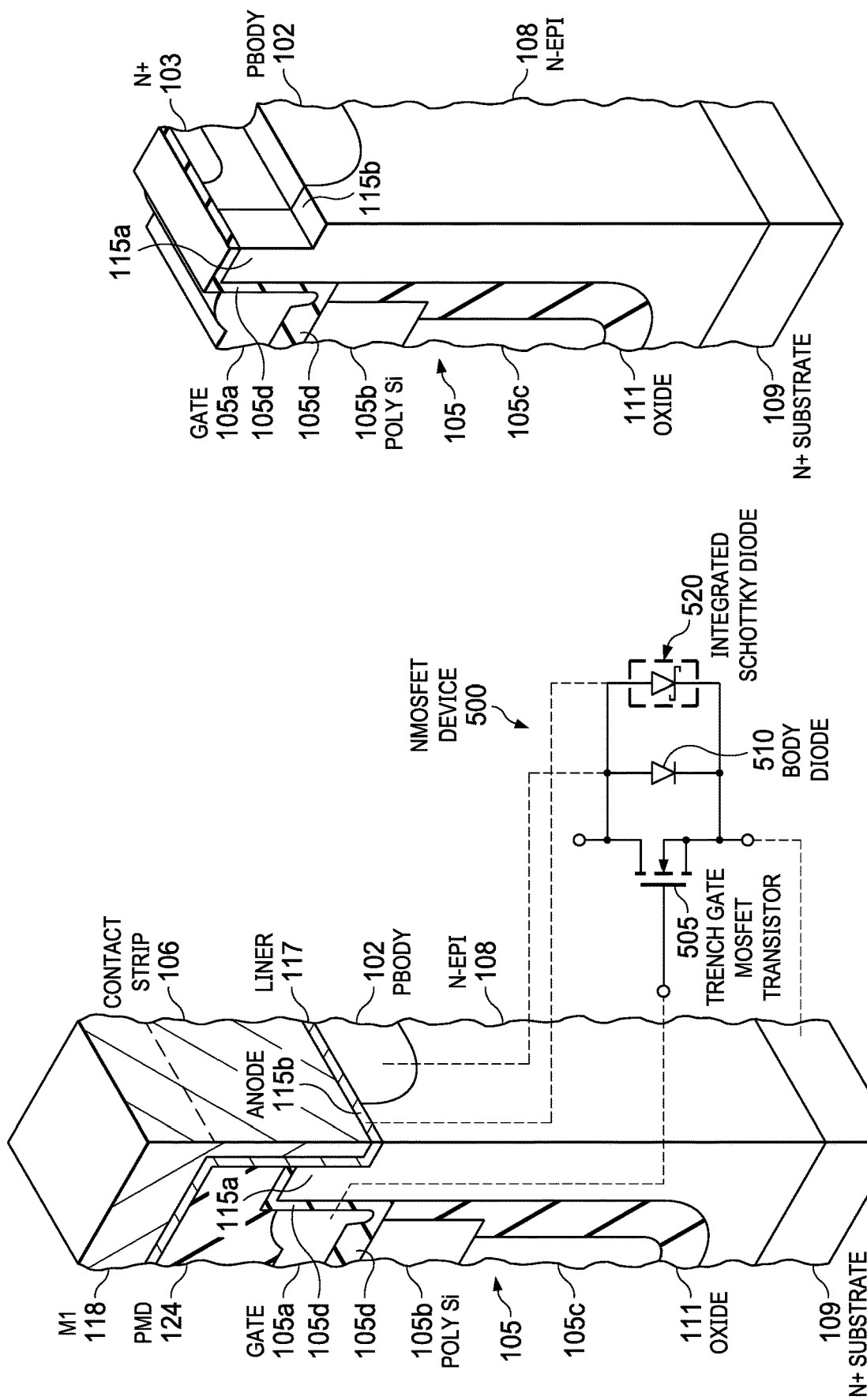

VERTICAL TRENCH GATE MOSFET WITH INTEGRATED SCHOTTKY DIODE

FIELD

This Disclosure relates to vertical trench gate metal oxide semiconductor field effect transistors (MOSFETs) that have Schottky barrier diodes.

BACKGROUND

One type of power MOSFET is a trench gate MOSFET which is designed to handle significant power and provide a high power drive capability by vertically conducting current from a top surface to a bottom surface of the die. The trench gate MOSFET generally includes a large number of MOSFET cells each including a trench formed in the die, with each trench having a surrounding body region and source region, and where the trenches are deep enough to cross through the opposite dopant type doped body regions below the top surface of the die. Each trench has a gate stack buried in the trench comprising a gate electrode generally comprising polysilicon on a gate dielectric which when biased controls the current conduction in the body region in their vicinity by virtue of the field effect that enables the MOSFET cells to be turned on enabling current to flow between the source and the drain.

The low drain to source resistance in the on-state or simply the on-resistance ($R_{ON}$) of a trench gate MOSFET may avoid the need for heat sinks which enables the device to be in a surface mount package for easier assembly on a printed circuit board (PCB). The $R_{ON}$ is commonly quoted as a specific $R_{ON}$ ($R_{ON}$,sp). The lowering of $R_{ON}$ is a major factor driving the demand for trench gate MOSFETs.

A Schottky diode is known in the art to be a metal-semiconductor junction diode that has a lower forward voltage drop (e.g., 0.2 to 0.3 volts) as compared to a conventional p-n semiconductor junction diode (0.6 to 0.7 volts). A Schottky diode may be added to the trench gate MOSFET cells connected in parallel to their body diode to improve switching performance. A Schottky diode connected in parallel to the body diode reduces the power dissipated by the trench gate MOSFET device, such as when the trench gate MOSFET device is part of a power converter (e.g., buck converter), enabled by the lower forward voltage drop and lower reverse recovery current of a Schottky diode as compared to the body diode. In a conventional trench gate MOSFET arrangement with a Schottky diode on the die, there is generally a dedicated Schottky diode area between adjacent trench gate MOSFET cells.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional trench gate MOSFET devices that embed a Schottky diode in a dedicated Schottky diode area of the die between trench gate MOSFET cells may undesirably increase the $R_{ON}$,sp of the trench gate MOSFET device. Disclosed trench gate MOSFET devices include Schottky barrier diodes that are instead integrated (or embedded) into the active area of the trench gate MOSFET cells of a trench gate MOSFET device. Such a configuration is expected to save die area and reduce the $R_{ON}$,sp as compared to conventional trench gate MOSFETs that include Schottky diodes that embed a Schottky diode between trench gate MOSFET cells.

Disclosed aspects include an integrated circuit (IC) comprising an n-type substrate having an n-type epitaxial (n-epi) layer thereon, a plurality of active trench gate MOSFET cells in an active area each including a corresponding one of a plurality of active trench gates in the epi layer, each active trench gate having a trench dielectric layer filled with a polysilicon gate over a spaced apart lower polysilicon portion. P-type body (pbody) regions are in an upper portion of the epi layer between adjacent ones of the plurality of the active trench gates, with adjacent pairs of p-type body regions having one of a plurality of surface regions of the n-epi layer located therebetween. There are n-type source regions at top surface regions of the n-epi layer within the body regions. A metal-containing layer is located directly on the surface regions of the n-epi layer. A metal layer over the metal-containing layer that electrically connects the p-type body regions, the n-type source regions and the surface regions of the n-epi layer.

Disclosed aspects include a trench gate MOSFET device that has MOSFET cells including active trench gates in an n-epi layer located over a semiconductor substrate. The active trench gates are oriented in a first direction and have a polysilicon gate over a lower polysilicon portion. P-body regions are located between the trench gates except in gap regions located between adjacent pbody regions. The body region gaps provide multiple exposed n-epi layer surface regions for contact to the n-epi layer. A gate dielectric layer is between the polysilicon gates and body regions. A pre-metal dielectric (PMD) layer on the n-epi layer has contact apertures therethrough for enabling contact to the first n-doped regions (e.g., sources) and pbody regions, and for contacting the exposed n-epi layer portions in the gaps between adjacent pbody regions. A metal or metal compound material contacts the n-epi surface layer regions to provide an anode to complete an embedded Schottky diode. A metal layer includes a metal contact for contacting the gates, a metal contact for contacting the p-body and first n-doped regions, and a metal contact for contacting the metal or metal compound layer.

Disclosed aspects also include a method of fabricating an IC, comprising forming a first vertical trench gate transistor within an n-type semiconductor substrate having a top surface, the first trench gate transistor comprising a first n-type region located at the top surface and between a first trench gate and a metal contact, and a first p-type region located between the first n-type region and the n-type substrate. A second vertical trench gate transistor is formed within the n-type semiconductor substrate, the second trench gate transistor comprising a second n-type region located at the top surface and between the first trench gate and the metal contact, and a second p-type region located between the second n-type region and the n-type substrate. A Schottky contact is formed by contacting the n-type substrate to form a Schottky diode between the first and second trench gate transistors, the Schottky contact comprising a metal-containing layer located directly on the n-type substrate. The method further comprises electrically connecting to the first trench gate transistor, to the second trench gate transistor, and to the Schottky diode.

BRIEF DESCRIPTION OF THE DRAWINGS

Reference will now be made to the accompanying drawings, which are not necessarily drawn to scale, wherein:

FIG. 5A shows a cross sectional view of a portion of an active trench gate MOSFET cell showing an integrated Schottky diode formed in an n-type epi region adjacent to the pbody region, having metal contacting the anode and the pbody (and as seen in FIG. 5B also the first doped region) with its equivalent circuit along with portions shown corresponding to the various nodes in the equivalent circuit, and FIG. 5B is 3-dimensional (3D) view of the FIG. 5A cross section with metal excluded that also show the first doped region within the pbody region.

DETAILED DESCRIPTION

Figure 1A:
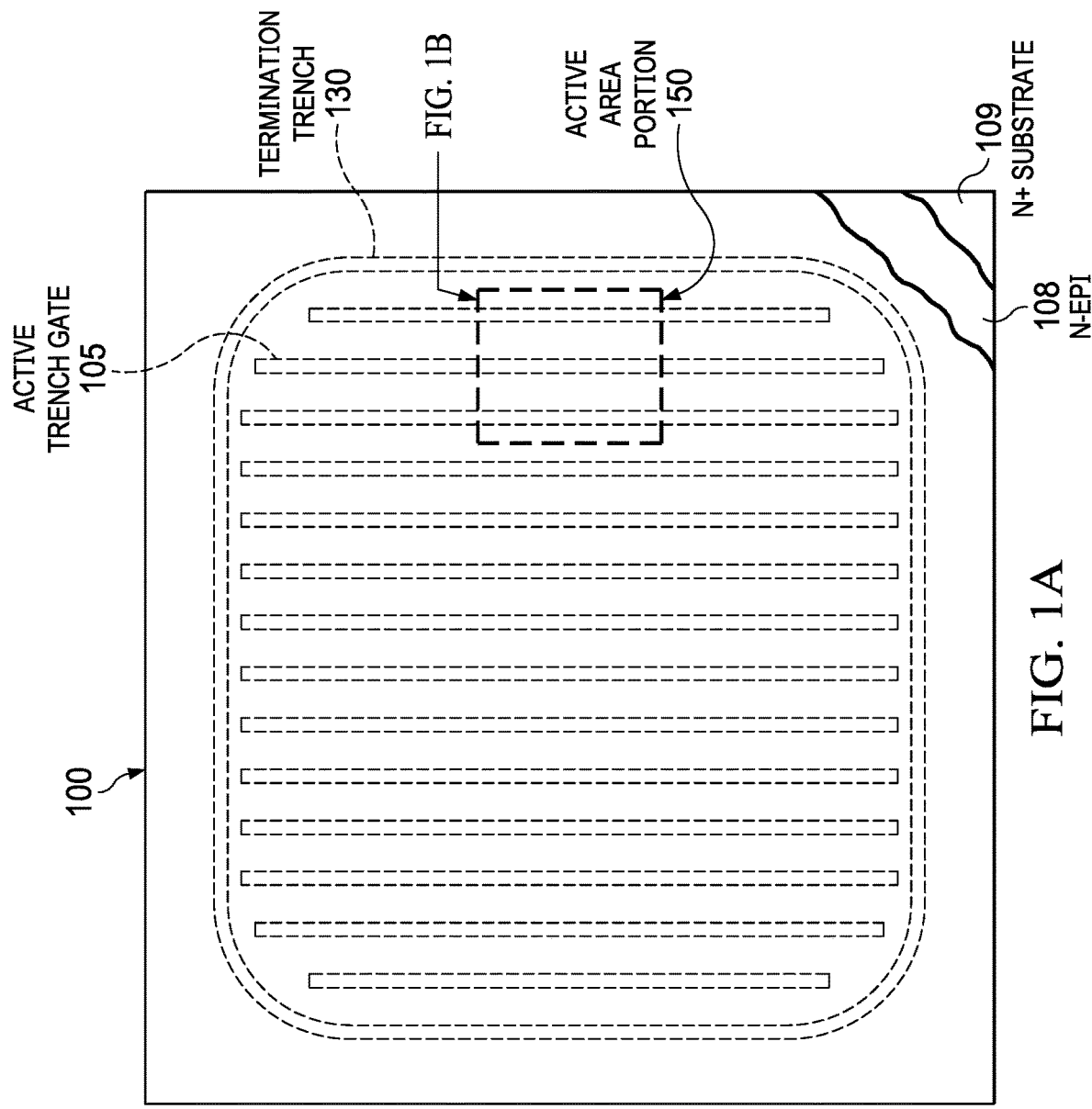
FIG. 1A is a high level top view depiction of a disclosed vertical trench gate MOSFET device with Schottky barrier diodes integrated into each trench gate MOSFET cell having an outer termination trench that provides a junction termination region which surrounds the active area, where the active area has the active trench gates shown being parallel to one another.

Example aspects in this disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize the total area of a trench gate MOSFET device having Schottky diodes can be reduced by integrating a Schottky diode into the trench gate MOSFET cells of the trench gate MOSFET device instead of the known use of a dedicated die area for the Schottky diodes next to the trench gate MOSFET cells. Various examples provide a Schottky contact to an epi layer surface region in gaps between pbody regions of each trench gate MOSFET cell with a metal or metal compound (e.g., TiN or TaN) Schottky contact to the epi layer surface region.

FIG. 1A is a high level top view depiction of a disclosed vertical trench gate NMOSFET device 100 with active trench gates 105 in an active area including integrated trench gate MOSFETs (FETs) 114 and Schottky diodes 115. (See FETs 114 and Schottky diodes 115 shown in FIGS. 1B, 2 and 3, described below.) An outer junction termination trench 130 provides a junction termination region which surrounds the active area.

The active trench gates 105 are shown with their length direction oriented parallel to one another. The trench gate MOSFET device 100 is shown formed within an n-epi layer 108 located on an n+ substrate 109 that provides an n+ drain contact for the trench gate MOSFET device. Although not shown, a metal drain contact layer (e.g., Ti/Ni/Ag) may be located on the bottom side of the n+ substrate 109. The termination trench 130 provides a junction termination region that surrounds the active area for the trench gate MOSFET device 100, and may enable the device to sustain a higher drain to source breakdown voltage (BV). A portion of the active area shown in FIG. 1A as active area portion 150 is described below relative to the top view depiction in FIG. 1B.

Figure 1B:
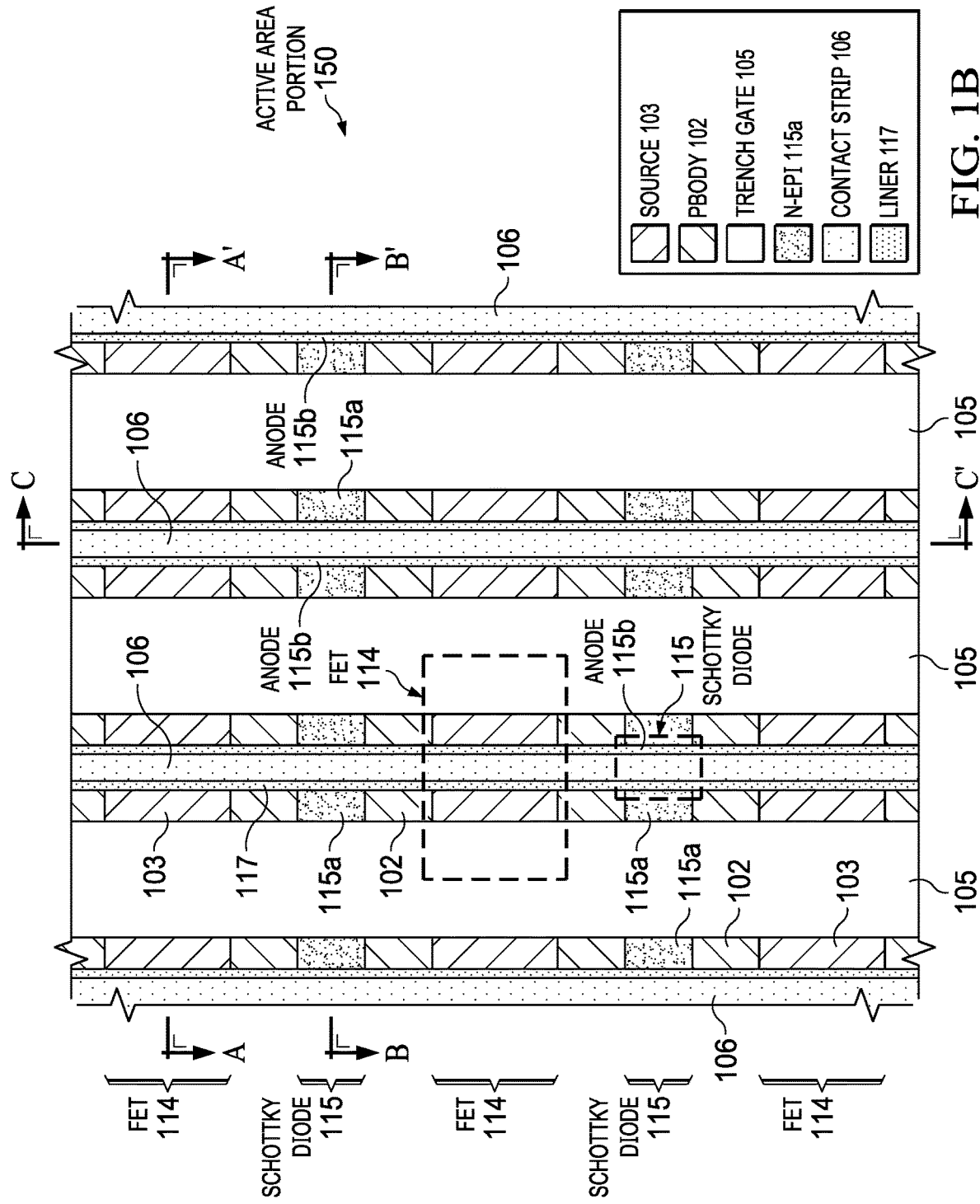
FIG. 1B is a top view of an active portion of the trench gate MOSFET device in FIG. 1A showing the active trench gates having associated integrated Schottky barrier diode portions positioned on pbody region gaps.

Referring now to FIG. 1B, the active area portion 150 is described in greater detail. Arrays of doped regions include pbody regions 102 and heavily doped n-type (n+) regions (e.g., source regions) 103 formed within the pbody regions 102. The n-type regions 103 may operate as sources in a vertical trench gate MOSFET structure as described further below. Without limitation, the n-type regions 103 may be referred to in the following discussion as source regions 103. Trench gates 105 enable turning on the trench gate MOSFET cells with a suitable polysilicon gate to pbody region 102 bias to form a conduction channel in the pbody region 102 which enables current to flow between the source regions 103 through the n-epi layer 108 as a drift region to the n+ substrate 109 that functions as the drain of the device.

Regarding Schottky barrier diode terminology used herein, a Schottky barrier is formed where a metal-containing material, sometimes a refractory metal or refractory metal compound, contacts the surface of the n-epi layer 108 shown as epi layer surface region 115a that is located in gaps between adjacent pbody regions 102. The epi layer surface regions 115a comprise the semiconductor side of the Schottky contact formed by a metal or metal compound contact liner 117 underlying a metal contact strip 106 contacting the epi layer surface regions 115a of the n-epi layer 108 (see FIG. 3). The portion of the contact liner 117 within the Schottky diode 115 forms a Schottky barrier with the epi layer surface region 115a and may function as the anode of the Schottky diode 115. Accordingly this portion of the contact liner 117 within the Schottky diode 115 may be referred to without limitation as the anode 115b of the Schottky diode 115. The n+ substrate 109 may function as the cathode of the Schottky diode 115. The epi layer surface region 115a is resistively coupled by the n-epi layer 108 acting as a drift region to the n+ substrate 109 on the bottom of the die, that as noted above may act as the FET's drain terminal and Schottky diode cathode terminal. A metal layer (not shown) may be formed on the n+ substrate 109.

The active area portion 150 shown includes several FETs 114 and Schottky diodes 115. Each FET 114 includes portions of adjacent active trench gates 105. Each Schottky diode 115 is located between two adjacent trench gates 105 and between two FETs 114, and is separated from nearest neighbor FETs 114 by pbody regions 102. As noted above, the epi layer surface regions 115a are each located between adjacent pairs of pbody regions 102. The pbody regions 102 bordering each Schottky diode 115 may act as a junction terminators for enhanced off-state voltage blocking for that Schottky diode 115.

Figure 2:
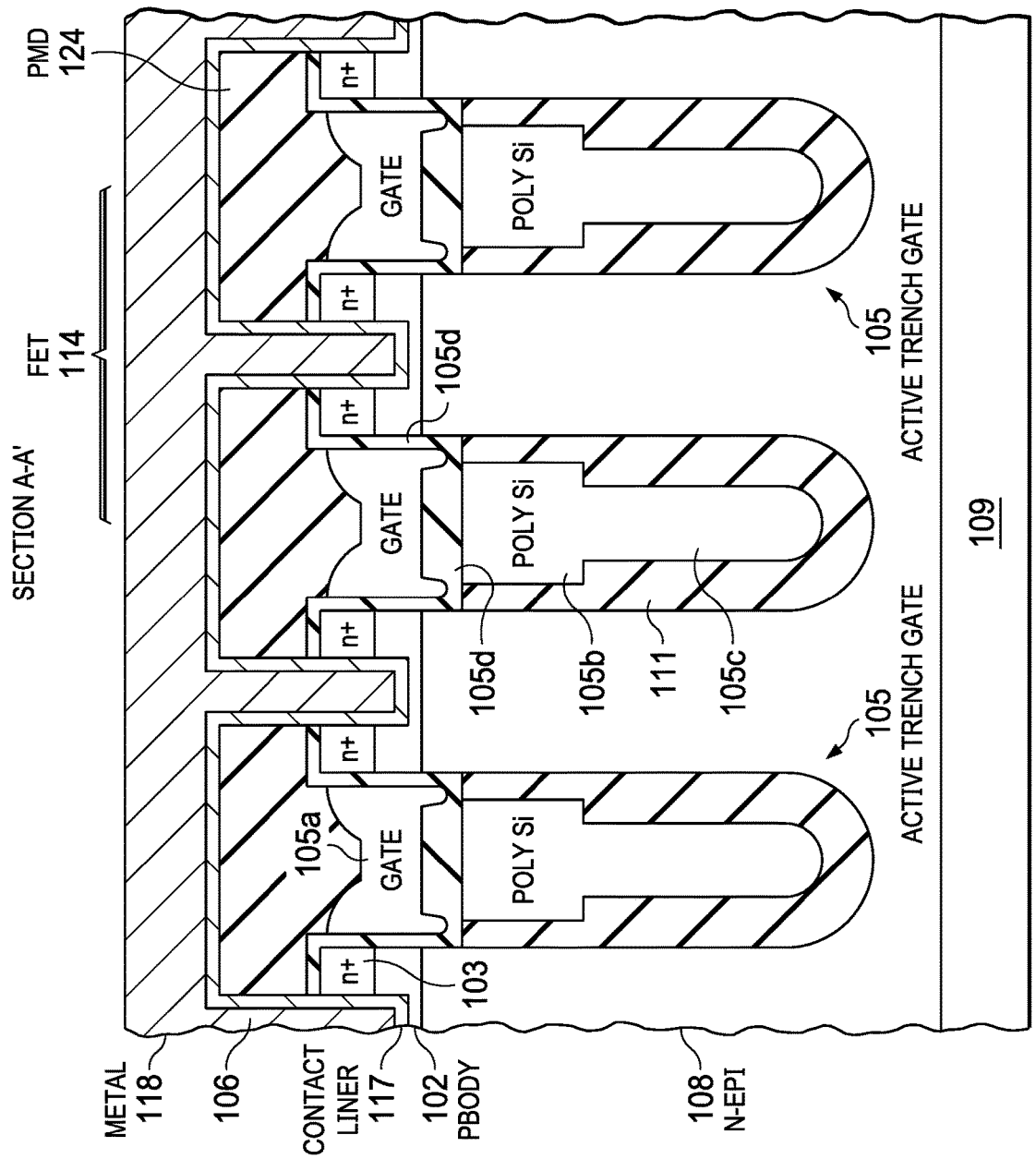
FIG. 2 shows a cross sectional view along a cutline shown as A-A' shown in FIG. 1B that is perpendicular to the length direction of the active trench gates, where the active trench gates are each shown with a double shield field plate, according to an example aspect.

FIG. 2 shows a cross sectional view along the cutline shown as A-A' in FIG. 1B that is perpendicular to the length direction of the active trench gates 105, and through two of the FETs 114 and three associated active trench gates 105. The active trench gates 105 are shown with an optional double shield field plate comprising a wider area top field plate portion 105b (with an associated narrower dielectric liner 111) over a narrower bottom field plate portion 105c (with a wider dielectric liner 111). The field plate portions 105b, 105c may be formed from polysilicon. The active trench gates 105 each include a polysilicon gate 105a over the double shield field plate portion 105b. The polysilicon gates 105a may be n-doped, while the polysilicon field plate portions 105b, 105c can be doped (n or p-type) or can be undoped.

A gate dielectric layer 105d associated with the polysilicon gate 105a has a horizontal portion between the gate 105a and the field plate 105b that may be thicker than a vertical portion is between the gate 105a and the pbody region 102/source region 103/n-epi 108 layer, e.g. due to a higher thermal oxidation rate for polysilicon relative to single crystal silicon. The different oxide growth rate may result in a small dip shown in FIG. 2 in the thickness of the gate dielectric layer 105d in the trench corners. A PMD layer 124 is shown over the source regions 103 and gates 105a.

A metal 1 (M1) layer 118, e.g. aluminum, is located over the PMD layer 124 and makes contact to the pbody regions 102 and the source regions 103 via the contact strips 106 that contact the contact liner 117. The M1 layer 118 and the contact strips 106 may be separately or collectively regarded as an interconnect layer. In one arrangement that is generally shown in the figures herein the contact strip 106 is the bottom portion of the M1 layer 118, which extends through the contact apertures formed in the PMD layer 124 and contacts features on the top surface of the n-epi layer such as the contact liner 117. In the present example, the pbody regions 102 are rectangular, with a major axis oriented perpendicular to the length direction of the active trench gates 105.

Although the illustrated example is shown with the active trench gates 105 having double shield field plates 105b, 105c, in other implementations the active trench gates 105 can have a single field plate. In such cases the field plate has a nominally uniform cross sectional area throughout. The doping level in the n-epi layer 108 may be decreased and the width of the n-epi layer 108 between adjacent active trench gate 105 edges may be decreased to meet a charge balance condition.

Figure 3:
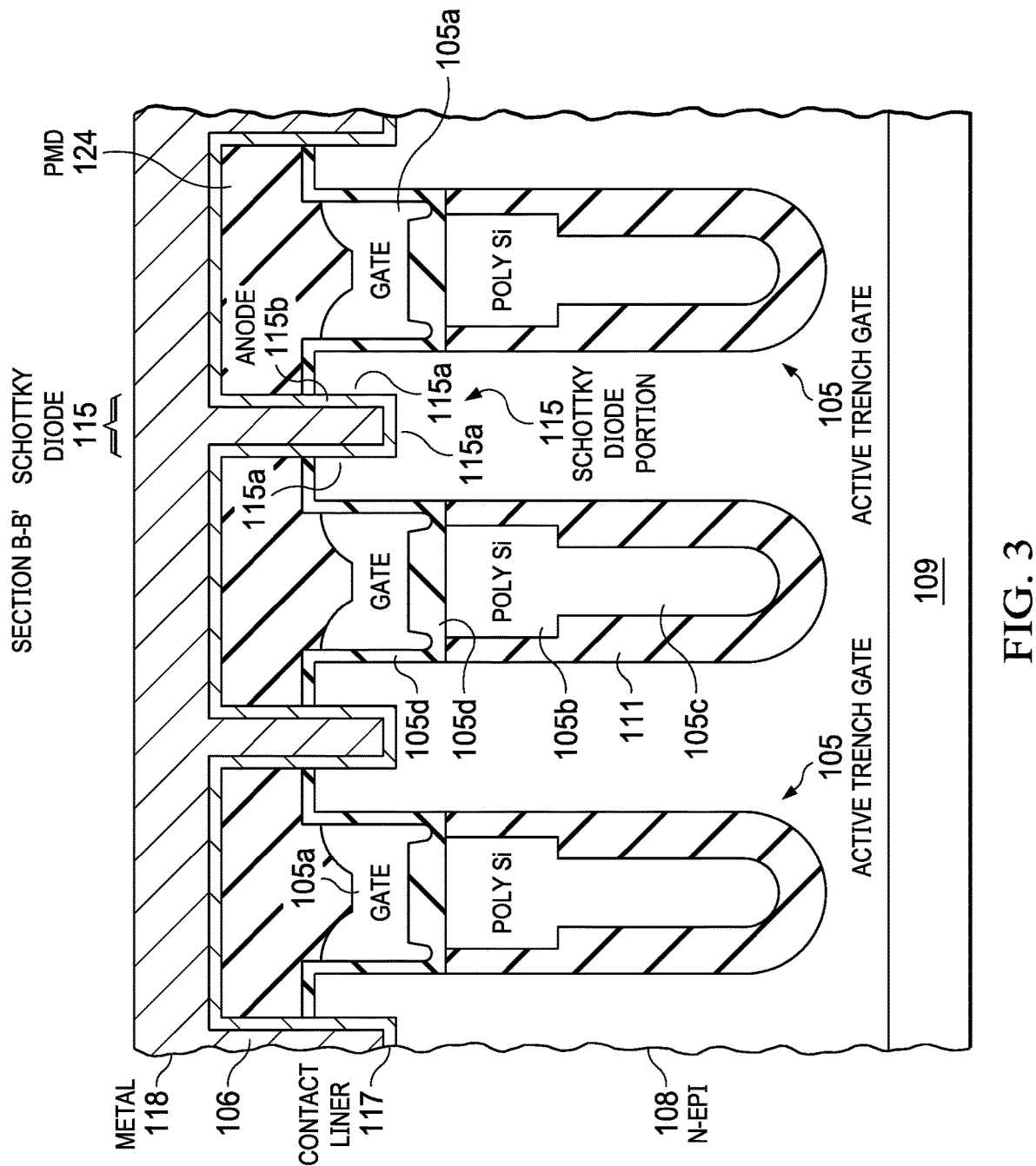
FIG. 3 is a cross sectional view along a cutline B-B' shown in FIG. 1B that is perpendicular to the length direction of the active trench gates in the Schottky diode portions shown, according to an example aspect.

FIG. 3 is a cross sectional view along the cutline B-B' shown in FIG. 1B that is perpendicular to the length direction of the active trench gates 105 in the Schottky diode portions 115, according to an example aspect. The anode 115b of each Schottky diode 115 is located on the epi layer surface region 115a of the n-epi layer 108 between nearest-neighbor instances of the active trench gates 105. As noted above, the n-epi layer 108 may operate as a drift region to the n+ substrate 109 which may function as the cathode contact of the Schottky diode 115 and the drain contact for the FET device.

The anode 115b (and contact liner 117) may include an elemental, alloyed or compounded metal. In some cases the metal is a refractory metal. As used herein, a "refractory metal" may be selected from the group consisting of Ti, Ta, Co, W. In addition to refractory metals, some non-refractory metals may be used for the contact liner 117 and thus for the anode 115b, e.g. Pt. In some examples, TiN or TaN may be used, and both compounds are compatible with microelectronic fabrication tools and facilities. The forward voltage drop and reverse leakage of the Schottky diode 115 is generally dependent on the selected metal or metal compound. It may be desirable to select a metal or metal compound that forms a Schottky contact with the epi layer surface region 115a at the anode 115b but forms an ohmic contact with the pbody region 102 and/or the source regions 103 when the contact liner 117 is over these regions. In a nonlimiting example, the thickness of the contact liner 117 may be in a range between about 10 nm and about 50 nm. As used herein throughout, "about" refers to ±5%.

Figure 4:
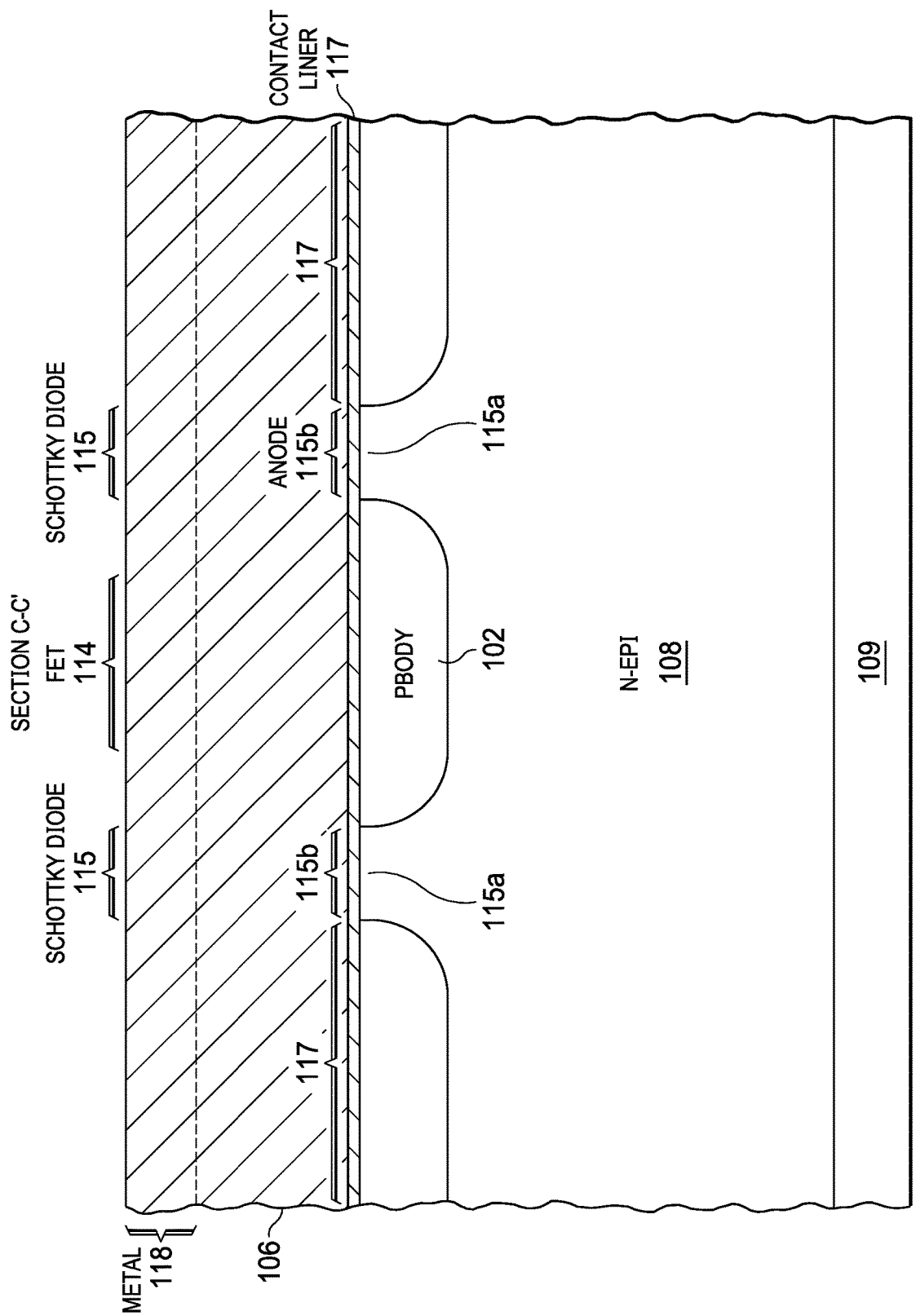
FIG. 4 is a cross sectional view along the cutline C-C' in FIG. 1B along the contact array that is parallel to the length direction of the trench gates that shows Schottky diode portions shown formed in n-epi layer regions between the pbody regions that are between the active gate trenches.

FIG. 4 is a cross sectional view along the cutline C-C' in FIG. 1B that is parallel to the length direction of the active trench gates 105. In this view three FETs 114 and two Schottky diodes 115 are visible. Within the FETs 114 only the pbody region 102 is present, as the source regions 103 have been removed by forming the contact strip 106. Active trench gates 105 are located ahead and behind the plane of the view provided so that they are not visible. Similarly there is no PMD layer 124 shown under the M1 layer 118 as this cross-section is along the contact strip 106. The contact liner 117 is present over the pbody regions 102, and the anodes 115b are located over the epi layer surface region 115a of the n-epi layer 108 in the Schottky diodes 115. The contact strip 106 connects to the pbody regions 102 and to the epi layer surface region 115a of the n-epi 108 via the contact liner 117 and the anodes 115b.

FIG. 5A shows a cross sectional view of a portion of an active trench gate MOSFET cell showing an instance of the integrated Schottky diode 115 formed in the n-epi layer 108 adjacent to the pbody region 102. The metal layer 118 over the contact strip 106 contacts the anode 115b provided by the contact liner 117 and the pbody region 102. The connection between the metal layer 118 and the source region 103 is hidden in this view. An equivalent circuit of the illustrated section is shown for reference, with nodes of the equivalent circuit matched to structural features of the section view by lead lines. The equivalent circuit shows the trench gate NMOSFET device 500 comprising a trench gate MOSFET transistor 505 an inherent body diode 510. The anode of the body diode 510 is related to the pbody region 102. An integrated Schottky diode 520 according to various examples described herein is connected in parallel with the body diode 510. The anode of the Schottky diode 520 is related to the anode 115b. The gate of the NMOSFET device 500 is related to the gate 105a. The drain of the NMOSFET device 500, the cathode of the body diode 510 and the cathode of the Schottky diode 520 are all tied to the n+ substrate 109.

FIG. 5B is a 3D view of the FIG. 5A cross section with the M1 layer 118, the contact strip 106, the anode 115b and the contact liner 117 removed. In addition to the n-epi layer 108 and the pbody region 102, the source region 103 is visible. The M1 layer 118 connects the pbody region 102, the source region 103, and the epi layer surface region 115a of the n-epi layer 108 via the contact liner 117, by ohmic contact on the sidewalls of the pbody region 102 and the source region 103, and by a Schottky contact on the sidewall of the epi layer surface region 115a.

FIGS. 6A-6J show successive cross sectional views of an example in-process disclosed vertical trench gate MOSFET device 600 with integrated Schottky barrier diodes in the active area cells corresponding to steps in an example method. FIGS. 6F-6J include a view through section A-A' of FIG. 1B, and a view through section B-B' of FIG. 1B. For the method described, the trench gates are described as having an optional double shield field plate, with the understanding the trench gates can also be single shield (e.g., a uniform cross sectional area) field plates. Previous processing has produced the n-epi layer 108 on the n+ substrate 109, or this stack is obtained commercially. In a nonlimiting example the n-epi layer 108 may have a concentration of an n-type dopant, such as phosphorus, in a range between about $1\times10^{15}$ cm$^{-3}$ and about $1\times10^{18}$ cm$^{-3}$, and the n+ substrate 109 may have a concentration of an n-type dopant, such as phosphorus, in a range between about $1\times10^{19}$ cm$^{-3}$ and about $1\times10^{20}$ cm$^{-3}$.

Figure 6A:
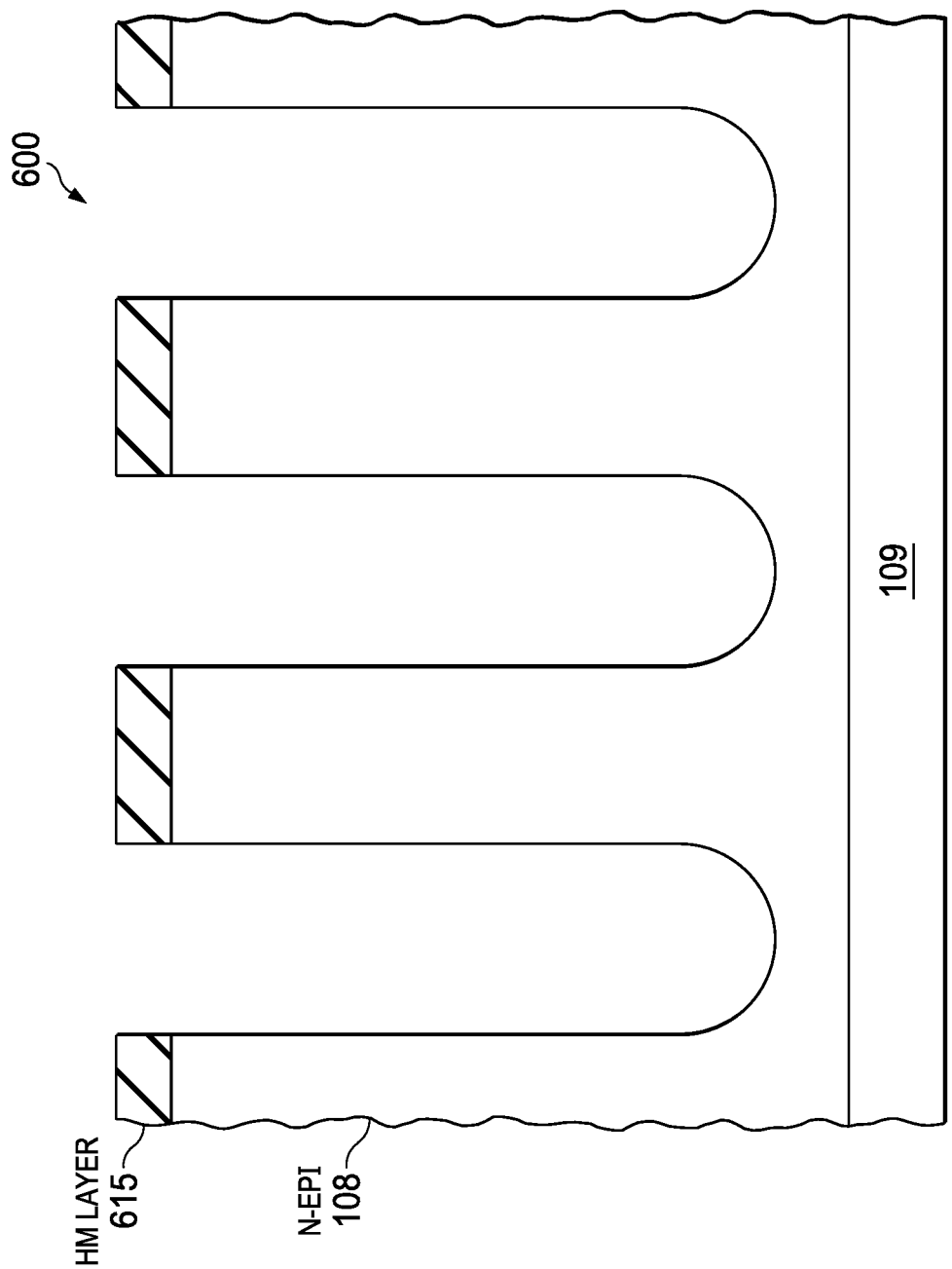
FIGS. 6A-6J show successive cross sectional views of an example in-process disclosed vertical trench gate MOSFET device with integrated Schottky barrier diodes in the MOSFET cells corresponding to steps in an example method of forming the trench gate MOSFET device, showing the active area corresponding to the cutline A-A' shown in FIG. 1B and the cross sectional view shown in FIG. 2, and showing the Schottky diode portion corresponding to the cutline B-B' shown in FIG. 1B and the cross sectional view shown in FIG. 3.

FIG. 6A shows a cross sectional view of the in-process trench gate MOSFET device 600 after formation of three example trenches in the n-epi layer 108, such as by Reactive Ion Etching (RIE). The patterning process may optionally employ a patterned hard mask layer, such as a silicon nitride hardmask (HM) layer 615. Although not shown, an optional thin pad oxide (SiO$_2$) layer may be located under the HM layer 615.

Figure 6B:
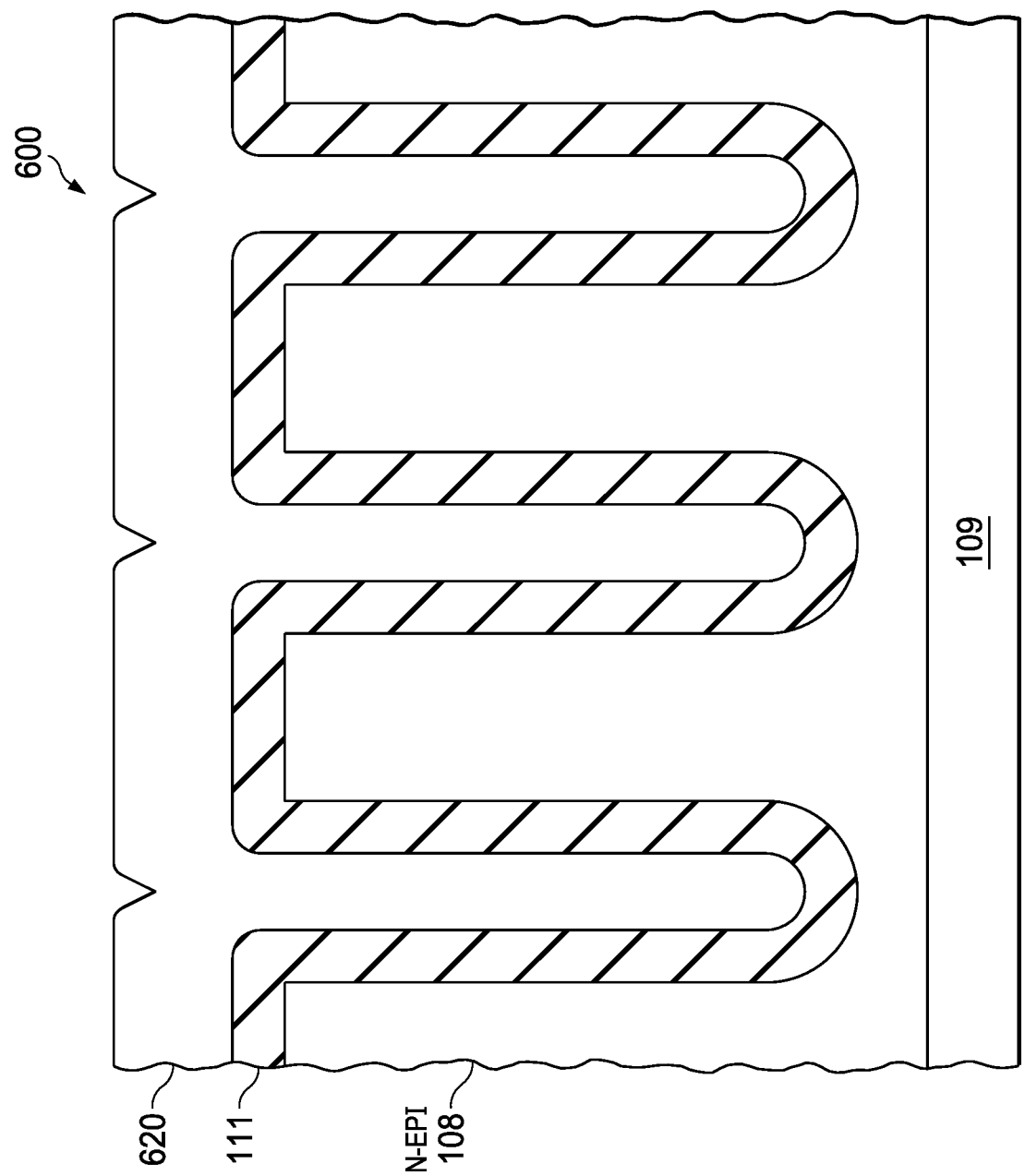

FIG. 6B shows a cross sectional view of the in-process trench gate MOSFET device 600 after forming the trench dielectric liner 111, followed by a polysilicon deposition for forming a polysilicon layer 620 that fills the trenches. The trench depth may be in a range between about 1 µm and about 10 µm. The trench dielectric liner 111 may be formed by growing a thermal oxide liner that may have a thickness in a range between about 50 nm and about 200 nm, followed by a silicon oxide layer which may be formed by subatmospheric chemical vapor deposition (SACVD) that may have a thickness in a range between about 100 nm and about 500 nm. The polysilicon layer 620 may be formed by CVD deposition to a thickness in a range between about 200 nm and about 800 nm. Optionally the polysilicon layer 620 may be doped by implantation of a dopant, e.g. phosphorus, to achieve a desired conductivity of the trench gates 105.

Figure 6C:
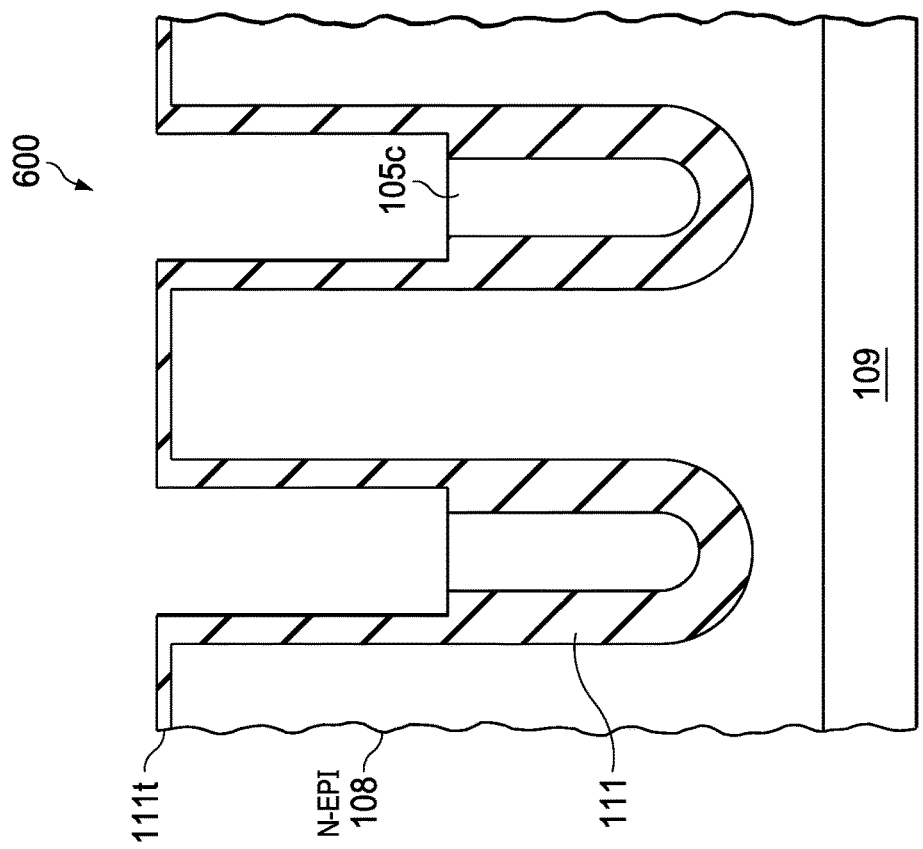
Figure 6D:
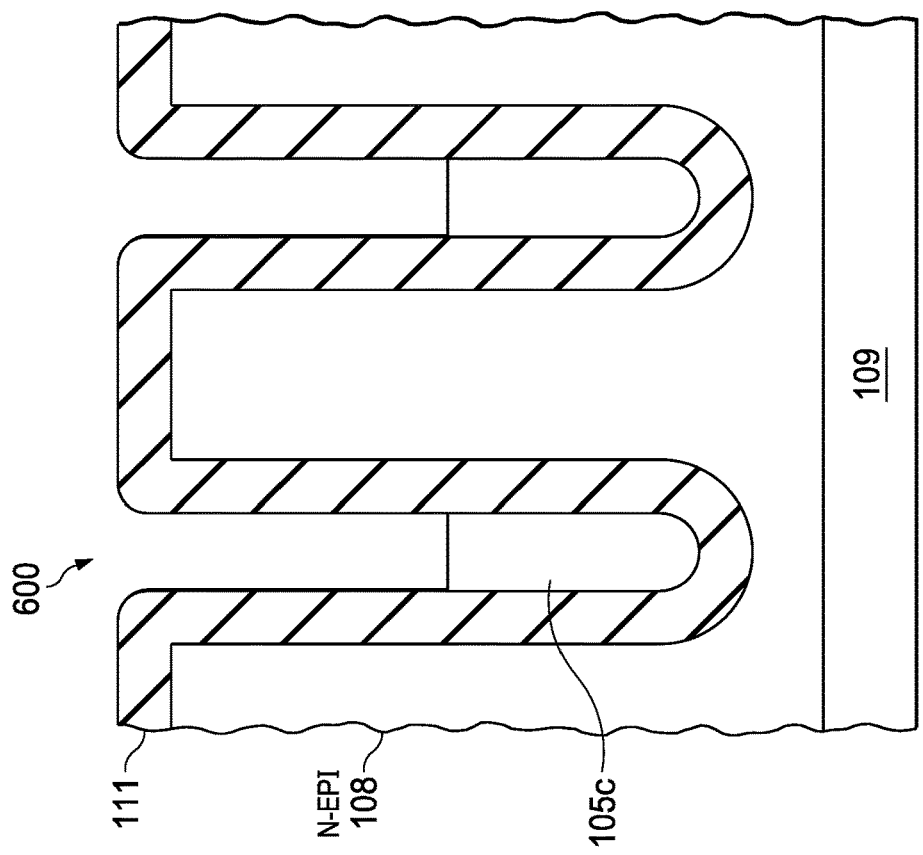
Figure 6E:
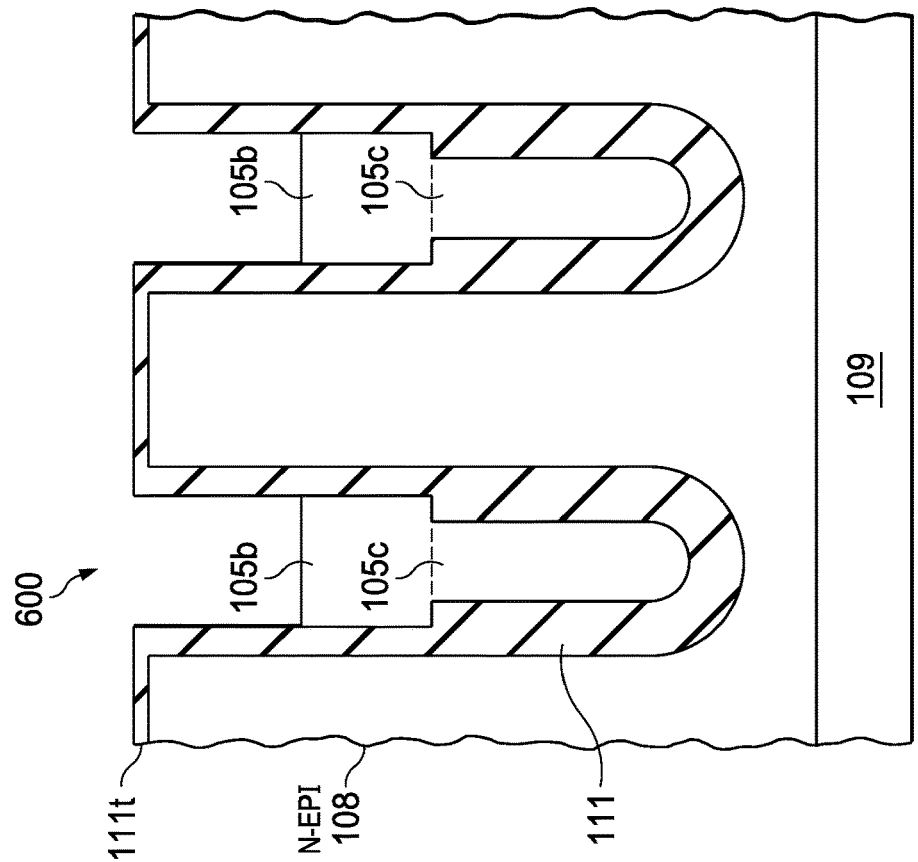

FIG. 6C shows the cross sectional view of the in-process trench gate MOSFET device 600 after polysilicon chemical mechanical planarization (CMP) that removes the polysilicon layer 620 overburden outside the trenches. The CMP process is followed by a polysilicon etch-back process that recesses the polysilicon layer 620 below the top surface of the n-epi layer 108. The polysilicon layer 620 remaining in the trenches is designated bottom plate portion 105c. FIG. 6D shows the cross sectional view of the in-process trench gate MOSFET device 600 after a trench dielectric liner 111 pull-back etch, e.g. a wet etch comprising hydrofluoric acid. The thinned trench oxide layer after the pull-back etch is shown as 111t. FIG. 6E shows a cross sectional view of the in-process trench gate MOSFET device 600 after forming a second CVD polysilicon layer for filling the trenches followed by a second polysilicon etch-back process to form the top field plate portion 105b to complete the double shield field plate that comprises 105b, 105a. As described above, the second polysilicon layer may optionally be doped to achieve a desired electrical conductivity.

Figure 6F:
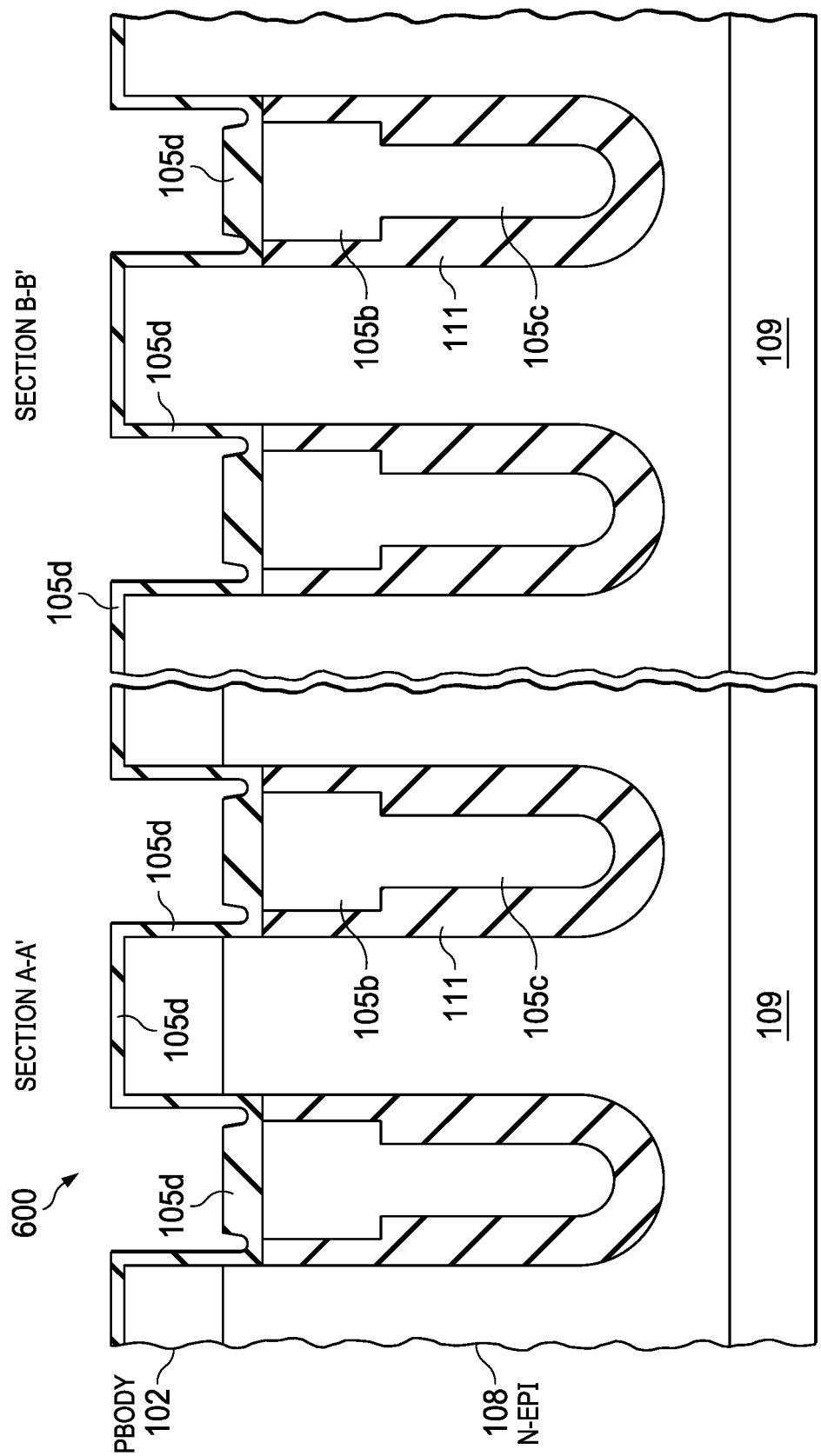

FIG. 6F shows the cross sectional view of the in-process trench gate MOSFET device 600 after a p-type dopant ion implantation step that forms the pbody regions 102 in section A-A'. The implantation process may provide a p-type dopant such as boron at a concentration in a range between of about $1\times10^{17}$ cm$^{-3}$ and about $1\times10^{18}$ cm$^{-3}$ in the pbody regions 102. A masking layer may be used to prevent the p-type dopant implantation from entering into the Schottky diode regions in section B-B'. Partial removal of the trench dielectric liner 111, e.g. by a wet etch, followed by thermal oxidation may be used to form the gate dielectric layer 105d shown. As described above and shown in FIG. 6F, in examples in which the gate dielectric layer 105d is a thermal oxide, this gate oxide layer may grow thicker over the exposed top of the polysilicon field plate portion 105b as compared to the single-crystal vertical sidewalls of the n-epi layer 108 and pbody regions 102 between the trenches. The vertical sidewalls of the gate dielectric layer 105d will become the gate dielectric of the trench gate MOSFET device 600, and may have a thickness in a range between about 10 nm and about 100 nm for implementations in which thermal silicon dioxide is used.

Figure 6G:
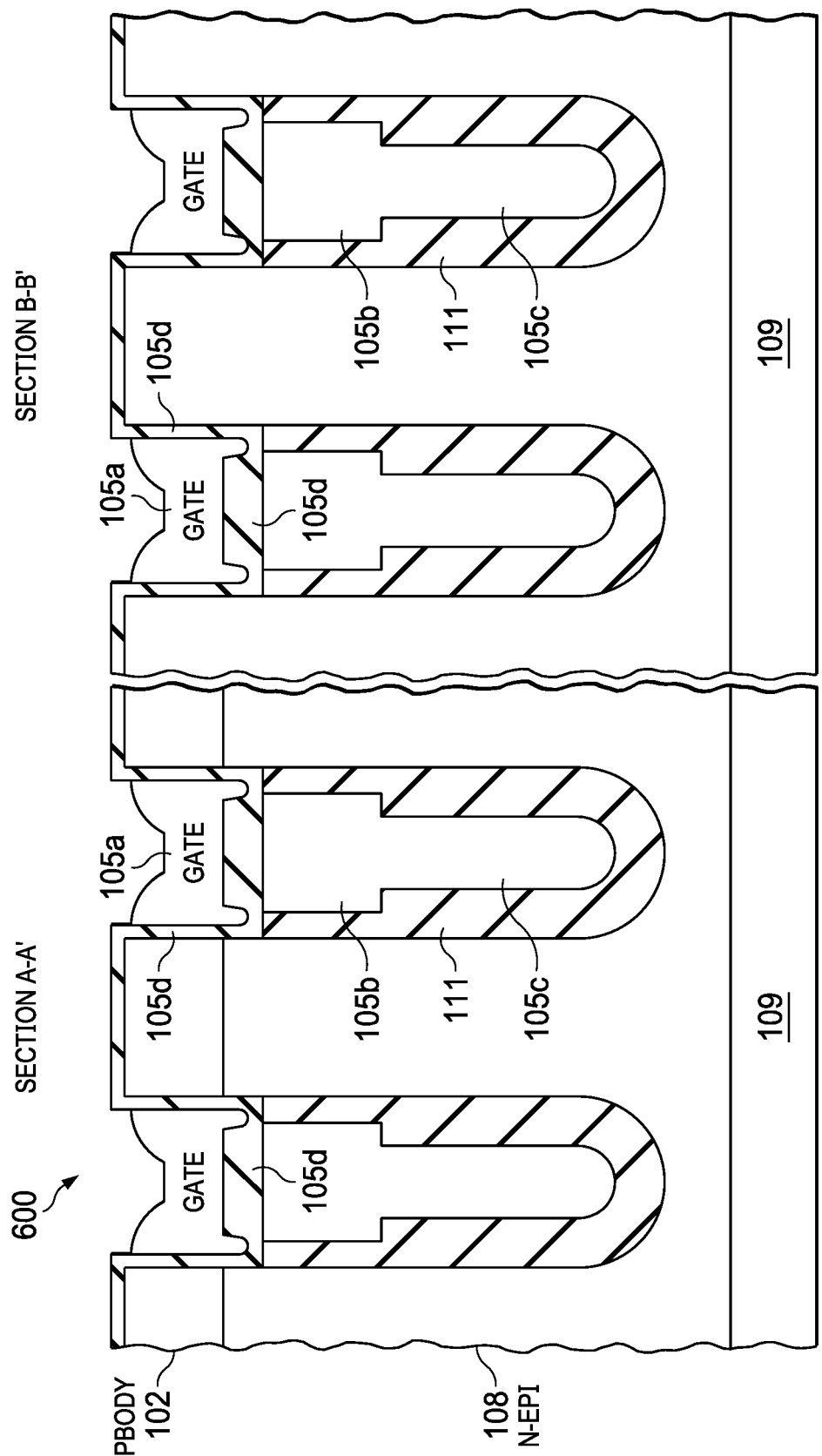

FIG. 6G shows the cross sectional view of the in-process trench gate MOSFET device 600 after gate polysilicon deposition on the gate dielectric layer 105d to form the gates 105a. The gate polysilicon may optionally be doped to provide a desired electrical conductivity of the gates 105a. Also optionally, a recess may be formed in the gates 105a, as shown, e.g. by a plasma etch process. In some cases the recessed gates may be desirable to provide more process margin for contacting the source region 103.

Figure 6H:
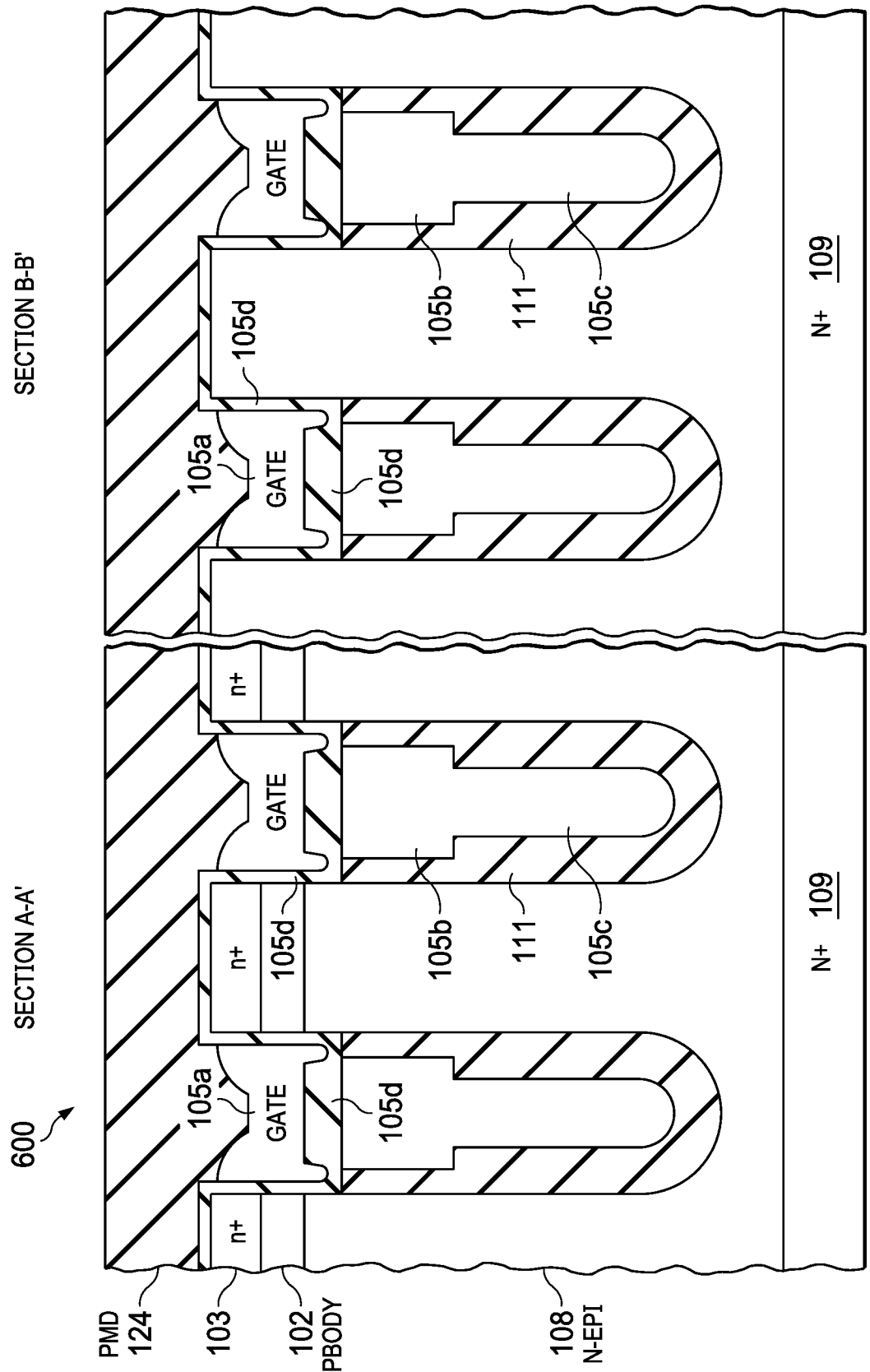

FIG. 6H shows a cross sectional view of the in-process trench gate MOSFET device 600 after forming the source regions 103, and then deposition of the PMD layer 124. A dielectric deposition, e.g. plasma enhanced CVD oxide, may be used to form the PMD layer 124. The source regions 103 may be formed by an implantation process that provides an n-type dopant such as phosphorous at a concentration in a range between of about $1\times10^{19}$ cm$^{-3}$ and about $1\times10^{20}$ cm$^{-3}$. A patterned mask may be used to prevent implantation into the trench gate MOSFET device 600 in the section B-B'.

Figure 6I:
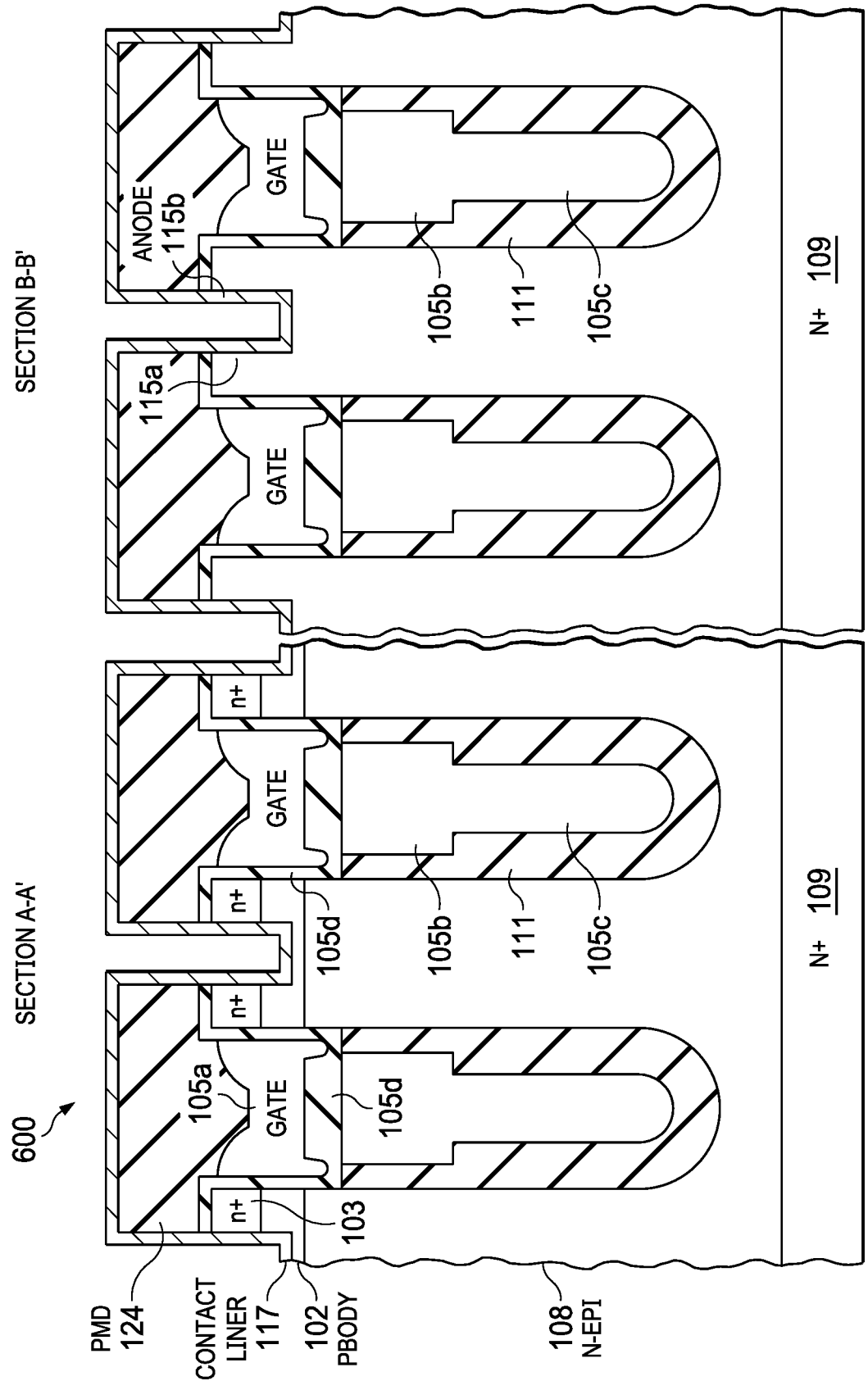

FIG. 6I shows a cross sectional view of the in-process trench gate MOSFET device 600 after forming contact apertures through the PMD layer 124 and filling the contact apertures with the contact liner 117. In the section A-A' the aperture extends through source region 103 to reach the pbody regions 102 for the active trench gate cells. In the section B-B' the aperture through the PMD layer 124 is provided to reveal the epi layer surface region 115a of the n-epi layer 108 (in the gap between adjacent pbody regions 102) for providing a contact for the contact liner 117 to provide an anode 115b on the epi layer surface region 115a as the cathode for the Schottky diode. Forming the contact apertures may include an oxide etch followed by a silicon etch in the case of non-planar contacts. The contact liner 117 is then formed within the apertures, with an optional pre-sputter etch preceding the contact liner deposition. In a nonlimiting example, forming the contact liner 117 may comprise a CVD TiN or CVD TaN deposition to a thickness of about 20 nm.

Figure 6J:
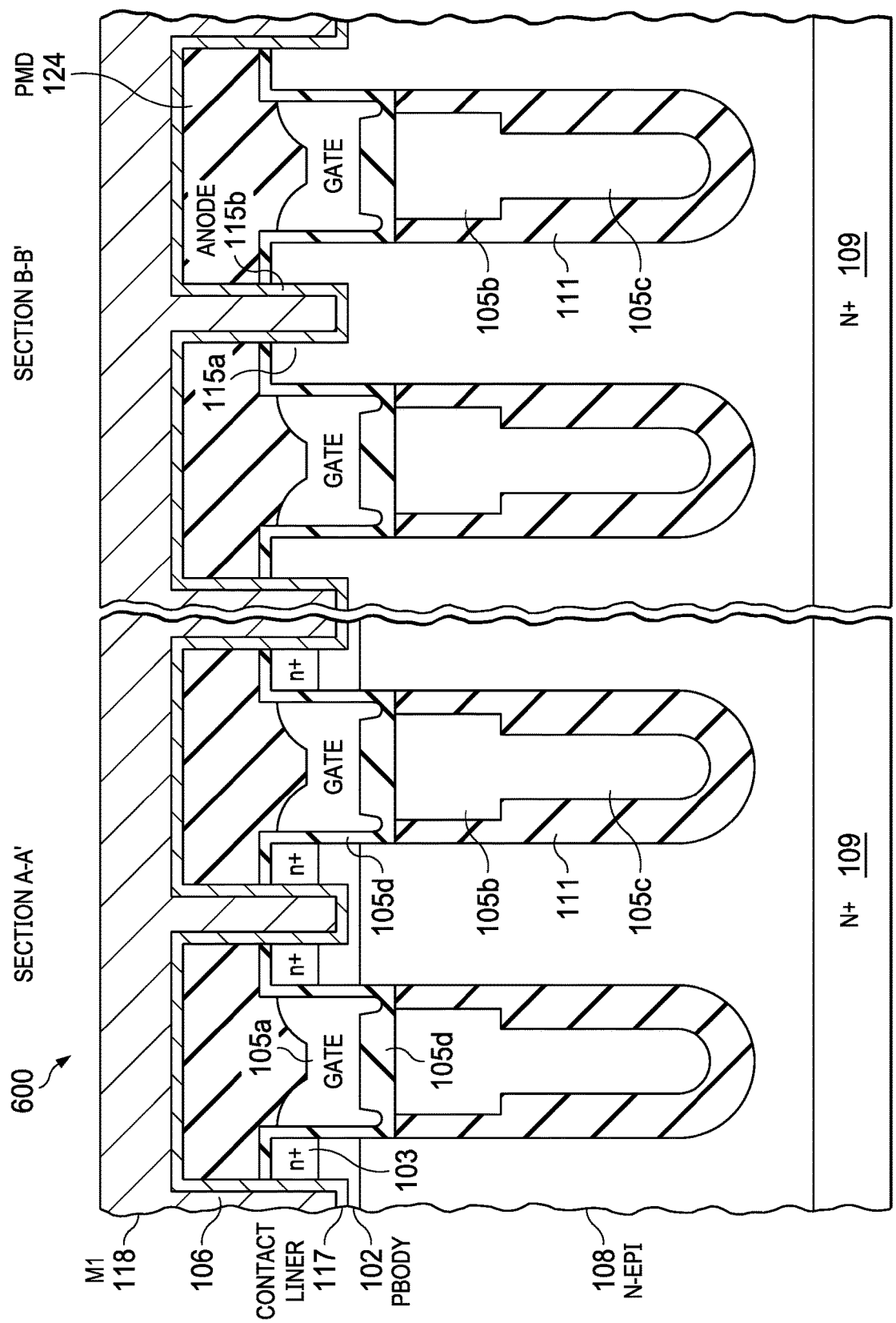

FIG. 6J shows a cross sectional view of the in-process trench gate MOSFET device 600 after forming the M1 layer 118 over the substrate and within the apertures in the PMD layer 124 that are lined with the contact liner 117. The portion of the M1 layer 118 within the apertures in the PMD layer 124 forms the contact strips 106. In the illustrated example the contact strips provide a non-planar contact to the epi layer surface region 115a, in that the contact strip 106 extends into the epi layer surface region 115a, and thus the bottom of the contact strip 106 is not coplanar with the surface of the n-epi layer 108. The metal formation process may include first forming a fill layer including tungsten (W) or cobalt (Co) within the apertures to provide the metal contact strips 106 shown, followed by forming an aluminum (Al) layer over the metal contact strips 106 to provide the M1 layer 118. The gates 105a may be connected by polysilicon runners to each other and to a gate terminal. One or more additional metals levels may follow, e.g. in the case of an IC to connect terminals of the trench gate MOSFET device 600 to other electronic devices on a same IC substrate.

Figure 8A:
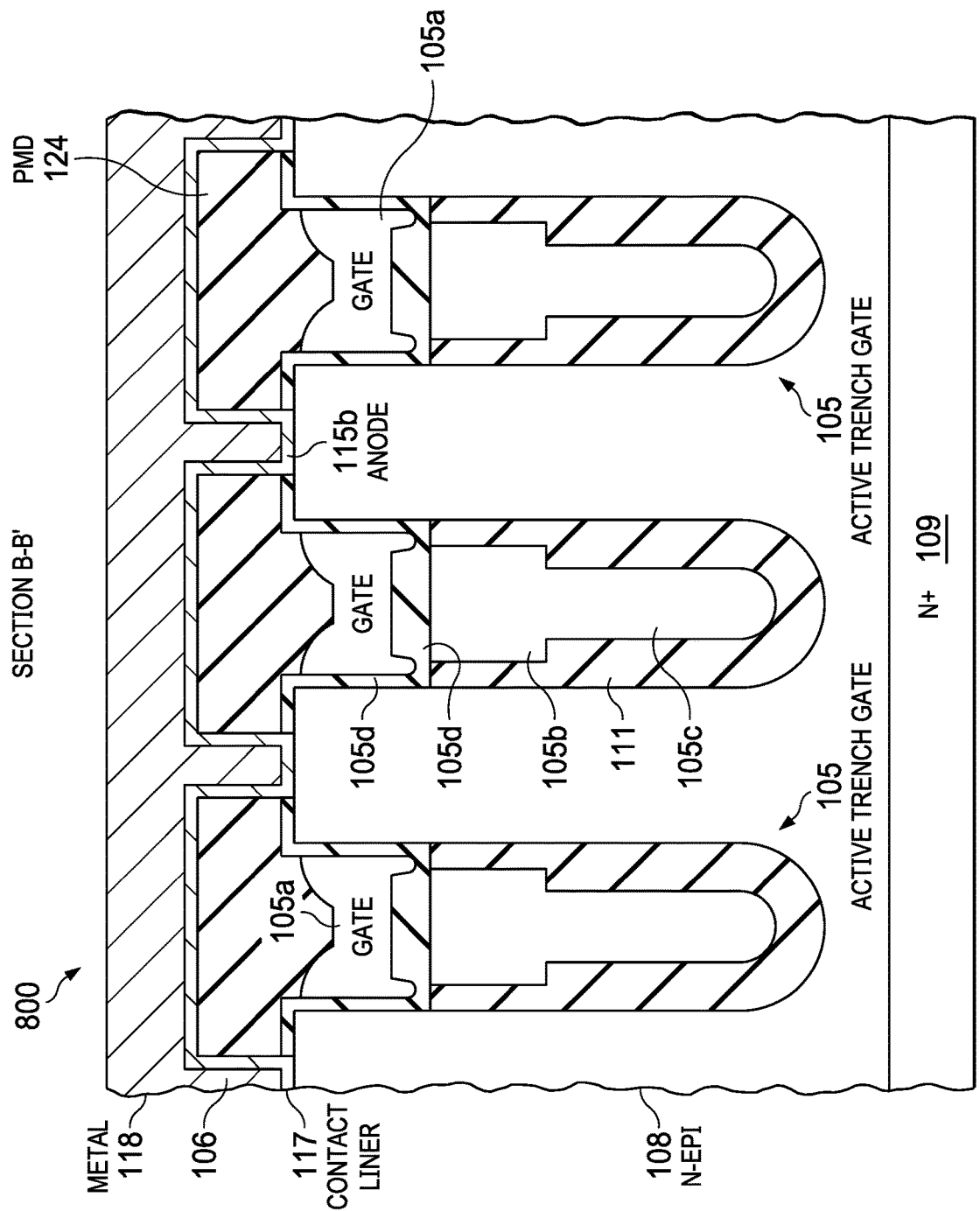
FIGS. 8A and 8B illustrate an alternate example of a trench gate MOSFET device that has contacts to the anodes of the Schottky diodes shown along cutlines B-B' and C-C', respectively, all being planar contacts. Metal contacts land on epi layer surface regions of the n-epi layer between pbody regions of the active trench gates that are coplanar with a top surface of the epi layer (cutline view B-B'), and metal contacts extend to provide planar contacts to the epi layer surface regions and pbody regions between the active trench gates (cutline view C-C').
Figure 8B:
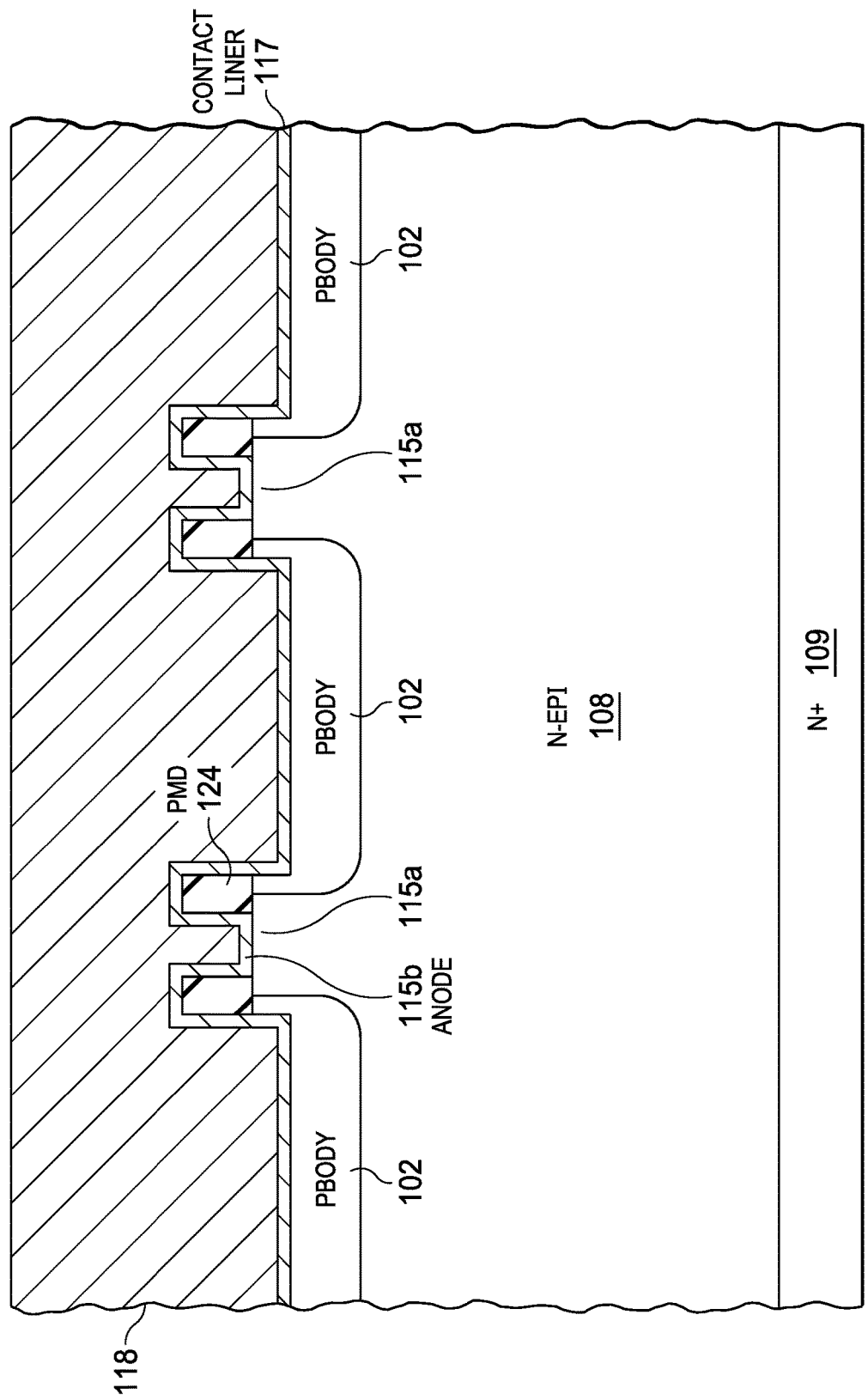

FIGS. 8A and 8B illustrate an alternate example of a trench gate MOSFET device 800 that is formed such that the Schottky contacts in the Schottky diodes 115 are planar, in that the contact strips 106 land about on the surface of the n-epi layer 108, and thus the bottom of the contact strip 106 is about coplanar with the surface of the n-epi layer 108 in the surface region 115a. FIG. 8A is along cutline B-B' and FIG. 8B is along cutline C-C', both cutlines being shown in FIG. 1B. Such a configuration may be desirable to reduce Schottky diode leakage as may occur at bottom corners of the anodes 115b in the Schottky diode structure of FIG. 3 and FIG. 6J.

In this example, a first mask may be used to pattern the apertures over the pbody regions 102 and source regions 103. A selective oxide etch process as previously described may be used to form deep apertures through the PMD layer 124 and into the pbody regions 102 to contact the n-doped regions. A second mask may be used to pattern apertures in the PMD layer 124 to expose the epi layer surface regions 115a for the Schottky diodes 115 between the pbody regions 102 of the active trench gates 105. An oxide etch process may be used to etch through the PMD 124 but stopping on the n-epi layer 108 thereby forming shallow apertures. The contact liner 117 may then be formed in the deep and the shallow PMD layer apertures, which may then be filled as previously described. A M1 layer 118 is shown contacting the contact liner 117. The metal within the deep and shallow apertures in the PMD layer 124 forms the metal contact strip 106, which in this example has a variable depth along the direction of the active trench gates 105. By providing planar Schottky contacts, such alternate implementations may reduce or eliminate leakage that may be present at corners of the anodes 115b of the Schottky diodes shown in the example of FIG. 3, e.g. due to electrical field concentration at the corners.

Disclosed trench gate power MOSFETs can be used in a variety of applications such as electronic switches in the power management applications. Disclosed trench gate power MOSFETs can be provided as a disclosed trench gate power MOSFET die, or as an IC having one or more disclosed trench gate power MOSFETs.

Figure 7:
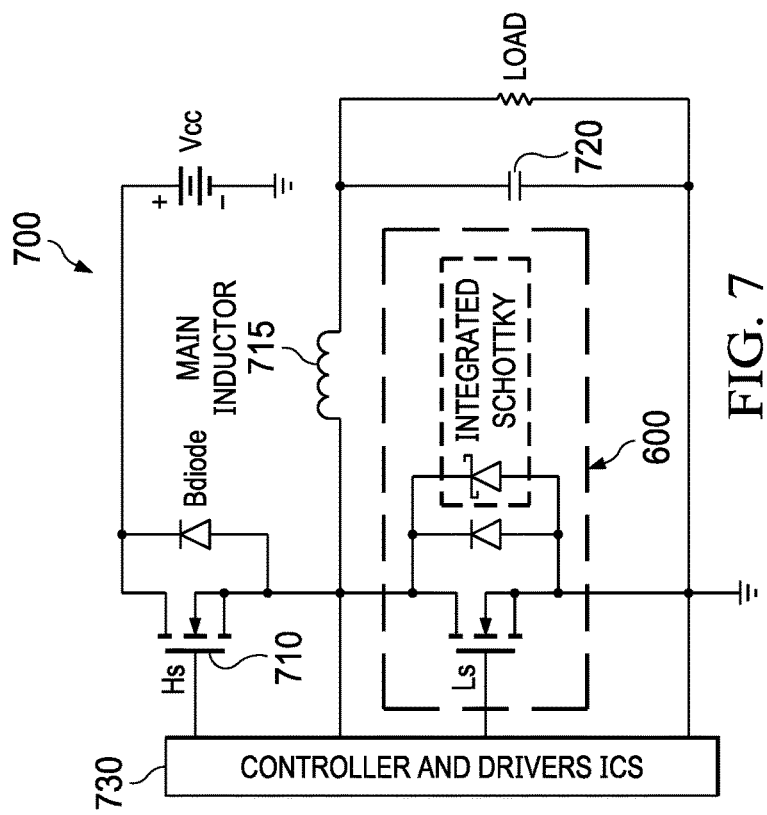
FIG. 7 is a high level depiction of a synchronized buck converter that utilizes a disclosed vertical trench gate MOSFET device with integrated Schottky barrier diodes as the low side power switch.

FIG. 7 is a high level depiction of an example IC shown as a synchronized buck converter 700 that utilizes the disclosed vertical trench gate MOSFET device 600 with integrated Schottky barrier diodes as the low side (LS) power switch. The synchronized buck converter 700 also include a high side (HS) power switch 710, and a main inductor 715 in series with an output capacitor 720. A block shown as controller and driver ICs 730 is coupled to the gates of the respective power switches to control their switching.

EXAMPLES

Disclosed aspects are further illustrated by the following specific Examples, which should not be construed as limiting the scope or content of this Disclosure in any way.

Technology computer aided design (T-CAD) simulations were performed for a disclosed vertical trench gate MOSFET based on the structure in the active area portion 150 shown in FIG. 1B. There was a 45% total active area increase for including disclosed integrated Schottky diodes that was found to significantly reduce the power dissipated by the trench gate MOSFET device, while the $R_{ON}$,sp only increased 13%, and without a noticeable degradation in the drain to source BV.

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:

1. A method of fabricating an integrated circuit, comprising;
    forming a first vertical trench gate transistor within an n-type semiconductor substrate having a top surface, the first vertical trench gate transistor comprising:
        a first n-type region located at the top surface and between a first trench gate and a metal contact; and
        a first p-type region located between the first n-type region and the n-type semiconductor substrate;
    forming a second vertical trench gate transistor within the n-type semiconductor substrate, the second vertical trench gate transistor comprising:
        a second n-type region located at the top surface and between the first trench gate and the metal contact; and
        a second p-type region located between the second n-type region and the n-type substrate, and
    forming a Schottky contact to the n-type semiconductor substrate, thereby forming a Schottky diode between the first and second vertical trench gate transistors, the Schottky contact located above a bottom boundary between the p-type regions and the n-type semiconductor substrate and comprising a metal-containing layer located directly on the n-type semiconductor substrate, and
    electrically connecting to the first vertical trench gate transistor to the second vertical trench gate transistor, and to the Schottky diode.

2. The method of claim 1, wherein the metal-containing layer comprises TiN or TaN.

3. The method of claim 1, wherein the first and second n-type regions are configured to operate as first and second source regions, respectively, of the first and second vertical trench gate transistors.

4. The method of claim 1, wherein the first and second vertical trench gate transistors include respective first and second polysilicon gates, and further comprising forming a recess in each of the first and second polysilicon gates.

5. The method of claim 1, wherein the metal-containing layer connects the first n-type region to the first p-type region, and connects the second n-type region to the second p-type region.

6. The method of claim 1, wherein the forming the Schottky contact includes etching through the first and second n-type regions and into the first and second p-type regions.

7. The method of claim 1, wherein a thickness of the metal-containing layer is within a range between about 10 nm and about 50 nm.

8. A method of fabricating an integrated circuit, comprising:
   forming first and second trenches within a lightly doped n-type epitaxial layer over a semiconductor substrate;
   forming first and second p-type body regions between the first and second trenches, and respective first and second n-type source regions over the first and second body regions, the first and second p-type body regions interfacing the n-type epitaxial layer at a first elevation above the substrate;
   forming a metal or metallic compound layer that touches the first and second body regions and the first and second source regions, and touches the epitaxial layer at a second elevation above the substrate greater than the first elevation.

9. The method of claim 8, wherein the metal or metallic compound layer comprises TiN or TaN.

10. The method of claim 8, wherein the metal or metallic compound layer comprises a refractory metal.

11. The method of claim 8, further comprising forming respective first and second polysilicon field plates within the first and second trenches, and forming respective first and second polysilicon gates over the first and second field plates.

12. The method of claim 8, wherein the metal or metallic compound layer forms a Schottky contact with the lightly doped n-type epitaxial layer.

13. The method of claim 12, wherein forming the Schottky contact includes etching through the first and second source regions and into the first and second body regions.

14. The method of claim 8, wherein a thickness of the metal or metallic compound layer is within a range between about 10 nm and about 50 nm.

15. The method of claim 8, wherein the first and second source regions are respective portions of first and second vertical trench gate MOSFETs, the first and second vertical trench gate MOSFETs being part of a two-dimensional array of vertical trench gate MOSFETs, each neighboring pair of vertical trench gate MOSFETs being separated by a corresponding Schottky contact for which the metal or metallic compound layer contacts the n-type epitaxial layer.

16. The method of claim 15, wherein the semiconductor substrate is configured to operate as a drain region of the first and second vertical trench gate MOSFETs.

17. The method of claim 8, wherein the metal or metallic compound layer connects the first n-type region to the first p-type region, and connects the second n-type region to the second p-type region.

18. The method of claim 8, wherein the first and second body regions are contiguously connected at a third elevation between the first elevation and the second elevation.

19. A method of fabricating an integrated circuit, comprising:
   forming first and second trenches within a lightly doped n-type epitaxial layer over a semiconductor substrate;
   forming first and second p-type body regions between the first and second trenches, and respective first and second n+ source regions over the first and second body regions, the first and second p-type body regions extending from a first elevation above the substrate to a second elevation above the substrate;
   forming a metal or metallic compound layer that touches the first and second body regions and the first and second source regions, and touches the epitaxial layer between the first and second body regions at a third elevation between the first and second elevations.

20. The method of claim 19, wherein the metal or metallic compound layer forms a Schottky contact with the lightly doped n-type epitaxial layer.

* * * * *